United States Patent
Madara et al.

(10) Patent No.: US 7,367,384 B2
(45) Date of Patent: May 6, 2008

(54) INTEGRATED HEAT EXCHANGERS IN A RACK FOR VERTICAL BOARD STYLE COMPUTER SYSTEMS

(75) Inventors: Steven Madara, Dublin, OH (US); Stephen Sillato, Westerville, OH (US); Thomas Harvey, Columbus, OH (US); Daniel Baer, Delaware, OH (US)

(73) Assignee: Liebert Corporation, Columbus, OH (US)

( * ) Notice: Subject to any disclaimer, the term of this patent is extended or adjusted under 35 U.S.C. 154(b) by 142 days.

(21) Appl. No.: 11/164,187

(22) Filed: Nov. 14, 2005

(65) Prior Publication Data

US 2006/0102322 A1    May 18, 2006

Related U.S. Application Data

(60) Provisional application No. 60/522,857, filed on Nov. 14, 2004.

(51) Int. Cl.
*F24H 3/06* (2006.01)
(52) U.S. Cl. .................................... 165/122; 361/696
(58) Field of Classification Search .............. 165/121, 165/122, 157; 62/411, 412; 361/678, 696
See application file for complete search history.

(56) References Cited

U.S. PATENT DOCUMENTS

| | | | |
|---|---|---|---|
| 3,317,798 A * | 5/1967 | Chu et al. ............... | 361/696 |
| 4,315,300 A | 2/1982 | Parmerlee et al. | |
| 5,150,277 A | 9/1992 | Bainbridge | |
| 5,161,087 A | 11/1992 | Frankeny et al. | |
| 5,273,438 A | 12/1993 | Bradley et al. | |
| 5,329,425 A | 7/1994 | Leyssens et al. | |
| 5,376,008 A | 12/1994 | Rodriguez | |
| 5,395,251 A | 3/1995 | Rodriguez et al. | |
| 5,402,313 A | 3/1995 | Casperson et al. | |
| 5,410,448 A | 4/1995 | Barker et al. | |
| 5,847,927 A * | 12/1998 | Minning et al. ........... | 361/696 |
| 6,046,908 A | 4/2000 | Feng | |
| 6,115,242 A | 9/2000 | Lambrecht | |
| 6,158,502 A | 12/2000 | Thomas | |
| 6,167,948 B1 | 1/2001 | Thomas | |
| 6,208,510 B1 * | 3/2001 | Trudeau et al. ........... | 361/696 |
| 6,310,773 B1 | 10/2001 | Yusuf et al. | |
| 6,416,330 B1 | 7/2002 | Yatskov | |
| 6,435,266 B1 | 8/2002 | Wu | |
| 6,515,862 B1 | 2/2003 | Wong et al. | |

(Continued)

OTHER PUBLICATIONS

International Search Report for Corresponding International Application No. PCT/US2005/040745.

(Continued)

*Primary Examiner*—Teresa J. Walberg
(74) *Attorney, Agent, or Firm*—Locke Lord Bissell & Liddell LLP

(57) ABSTRACT

A system for cooling heat-generating objects, such as computer boards situated in a rack, includes an enclosure in which the heat generating objects are situated. The enclosure has an air inlet and an air outlet, and a fan induces airflow into the air inlet, through the enclosure and out the air outlet. A heat exchanger is situated in the enclosure such that the heat exchanger is in a spaced apart relationship with the heat-generating object. Air moving through or past the heat-generating object is warmed, and the heat exchanger removes the heat before the air exits the enclosure.

19 Claims, 3 Drawing Sheets

U.S. PATENT DOCUMENTS

| | | | |
|---|---|---|---|
| 6,519,955 | B2 | 2/2003 | Marsala |
| 6,550,530 | B1 | 4/2003 | Bilski |
| 6,557,624 | B1 | 5/2003 | Stahl et al. |
| 6,564,858 | B1 | 5/2003 | Stahl |
| 6,628,520 | B2 * | 9/2003 | Patel et al. ............. 361/696 |
| 6,644,384 | B2 | 11/2003 | Stahl |
| 6,679,081 | B2 | 1/2004 | Marsala |
| 6,772,604 | B2 | 8/2004 | Bash |
| 6,992,889 | B1 | 1/2006 | Kashiwagi et al. |
| 6,999,316 | B2 | 2/2006 | Hamman |
| 2001/0042616 | A1 * | 11/2001 | Baer ........................ 361/696 |
| 2001/0052412 | A1 | 12/2001 | Tikka |
| 2002/0039280 | A1 * | 4/2002 | O'Connor et al. .......... 361/690 |
| 2003/0051859 | A1 * | 3/2003 | Chesser et al. .............. 165/46 |
| 2004/0184233 | A1 * | 9/2004 | Yamada ..................... 361/690 |
| 2005/0120737 | A1 | 6/2005 | Borror et al. |
| 2005/0168945 | A1 | 8/2005 | Coglitore |

OTHER PUBLICATIONS

Written Opinion of the International Searching Authority for Corresponding International Application No. PCT/US2005/040745.

Baer, D.B., "Emerging Cooling Requirements & Systems in Telecommunications Spaces", in Telecommunications Energy Conference 2001, Oct. 14-18, 2001, pp. 95-100.

"Managing Extreme Heat Cooling Strategies for High-Density Computer Systems," Liebert Corporation, Dec. 7, 2003, Columbus, OH, 16 pages.

Vogel, Marlin et al., "Low Profile Heat Sink Cooling Technologies for Next Generation CPU Thermal Designs," Electronic Cooling Online, Feb. 17, 2005, 11 pages.

Webb, Warren, "Take the heat: Cool that hot embedded design," EDN, May 13, 2004, 5 pages.

Jamstec/Earth Simulator Center, "Processor Node (PN) Cabinet," one page http://www.es.jamstec.go.jp/esc/eng/Hardware/pnc.html [accessed Mar. 5, 2004].

Hannemann, Robert et al., "Pumped Liquid Multiphase Cooling," ASME, 2004, IMECE 2004, Paper IMECE2004-60669, Anaheim, CA, 5 pages.

"Thermal Form & Function - Rack Cooling System (RCS)," Thermal Form & Function LLC, 2005, Manchester, MA, one page, http://www.thermalformandfunction.com/racksystem.html [accessed May 11, 2006].

Pitasi, M. "Thermal Management System Using Pumped Liquid R-134a with Two Phase Heat Transfer," Thermal Form & Function LLC, Manchester, MA, http://www.coolingzone.com/Guest/News/NL_Mar_2002/TFF/tff.html, pp. 1-9, Mar. 2002.

Marsala, Joe, "Pumped Liquid/Two Phase Cooling for High Performance Systems," Thermal Form & Function LLC, May 13, 2003, Scottsdale, AZ, 19 pages.

* cited by examiner

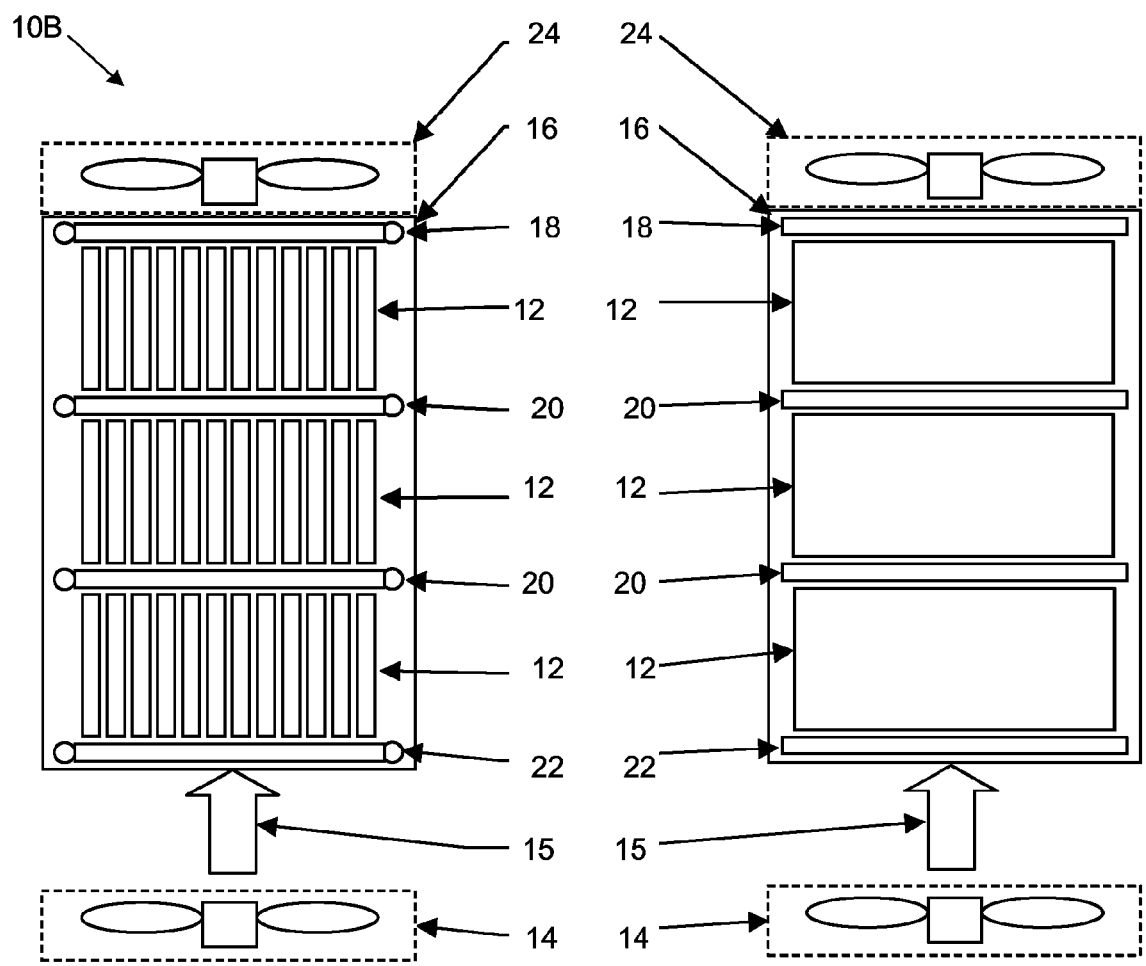
FIG. 3  FIG. 4

INTEGRATED HEAT EXCHANGERS IN A RACK FOR VERTICAL BOARD STYLE COMPUTER SYSTEMS

CROSS REFERENCE TO RELATED APPLICATIONS

The present application claims priority to U.S. Provisional Patent Application Ser. No. 60/522,857 filed Nov. 14, 2004, the contents of all of which are incorporated herein by reference.

BACKGROUND

The present disclosure relates to systems for cooling electronic and other heat-generating equipment, and more particularly to systems for cooling the air flowing in proximity to electronic equipment configured in vertical banks in a rack or cabinet.

The growth of the computer industry over the past few decades has been phenomenal. Many new computer designs combine multiple computer/processor boards to make "high end" computers and "servers". Due to the demand for floor space, computer boards are often configured to be "stacked" vertically in a rack or cabinet. Many existing cooling systems for electronic equipment contained in such a vertical rack do not provide adequate cooling. In many of these cooling systems, air is drawn into the bottom of the rack or cabinet containing computer boards and moved vertically through the cabinet, progressively cooling the respective computer boards. In this design, the boards mounted "higher" in the rack receive warmer air than those mounted toward the bottom because the air has already passed over and absorbed heat from one or more boards. Consequently, the "higher" boards are not adequately cooled by the flow of warmer air.

At the same time, newer, more powerful microprocessors are constantly being introduced, but this higher performance is generally accompanied by significantly increased heat generation. Thus, these newer processor configurations are driving up heat loads to the point that "unaided" air cooling cannot provide enough capacity to keep these "stacked" computers from overheating. As a result, "stacked" servers may have to operate at reduced processing speeds to limit the heat load, which in turn compromises performance.

In addition, existing cooling systems have a rather limited cooling capability. For instance, many existing cooling systems have heat densities of approximately 80 watts per square foot (W/ft$^2$), though some cooling systems still under development are said to possess heat densities of up to 150 W/ft$^2$. Even cooling systems having these heat densities, however, may not effectively cool today's state-of-the-art electronic equipment.

As is readily apparent, if equipment is not sufficiently cooled, the internal temperature of the electronic components in the equipment dramatically increases over relatively short periods of time, which may result in significantly reduced system performance and, in some cases, component or total system failure. Even where system performance is not compromised, inefficient cooling may unnecessarily increase the cost of cooling the equipment. Thus, there remains a need for a cooling system that adequately and efficiently cools computer boards configured in vertical banks in a rack.

SUMMARY

A system for cooling heat generating objects, such as computer boards situated in a rack, includes an enclosure in which the heat generating objects are situated. The enclosure has an air inlet and an air outlet, and a fan induces air flow into the air inlet, through the enclosure and out the air outlet. The fan may be situated adjacent the air inlet or outlet, or multiple fans may be used at the inlet and outlet. A heat exchanger is situated in the enclosure such that the heat exchanger is in a spaced apart relationship with the heat-generating object. Air moving through or past the heat-generating object is warmed, and the heat exchanger removes the heat before the air exits the enclosure.

In certain exemplary embodiments, the heat exchanger is situated adjacent the air inlet. In further embodiments, the heat exchanger is situated adjacent the air outlet, or heat exchangers are situated at both the inlet and outlet of the enclosure. Often, a plurality of heat-generating objects are situated vertically in the enclosure, and a plurality of heat exchangers are situated in the enclosure such that a heat exchanger is situated between adjacent heat generating objects in a spaced-apart relationship.

BRIEF DESCRIPTION OF THE DRAWINGS

Other objects and advantages of the invention will become apparent upon reading the following detailed description and upon reference to the drawings in which:

FIGS. 3 and 4 are front and side views, respectively, schematically illustrating another system for cooling heat generating objects in a cabinet.

Figure 1:
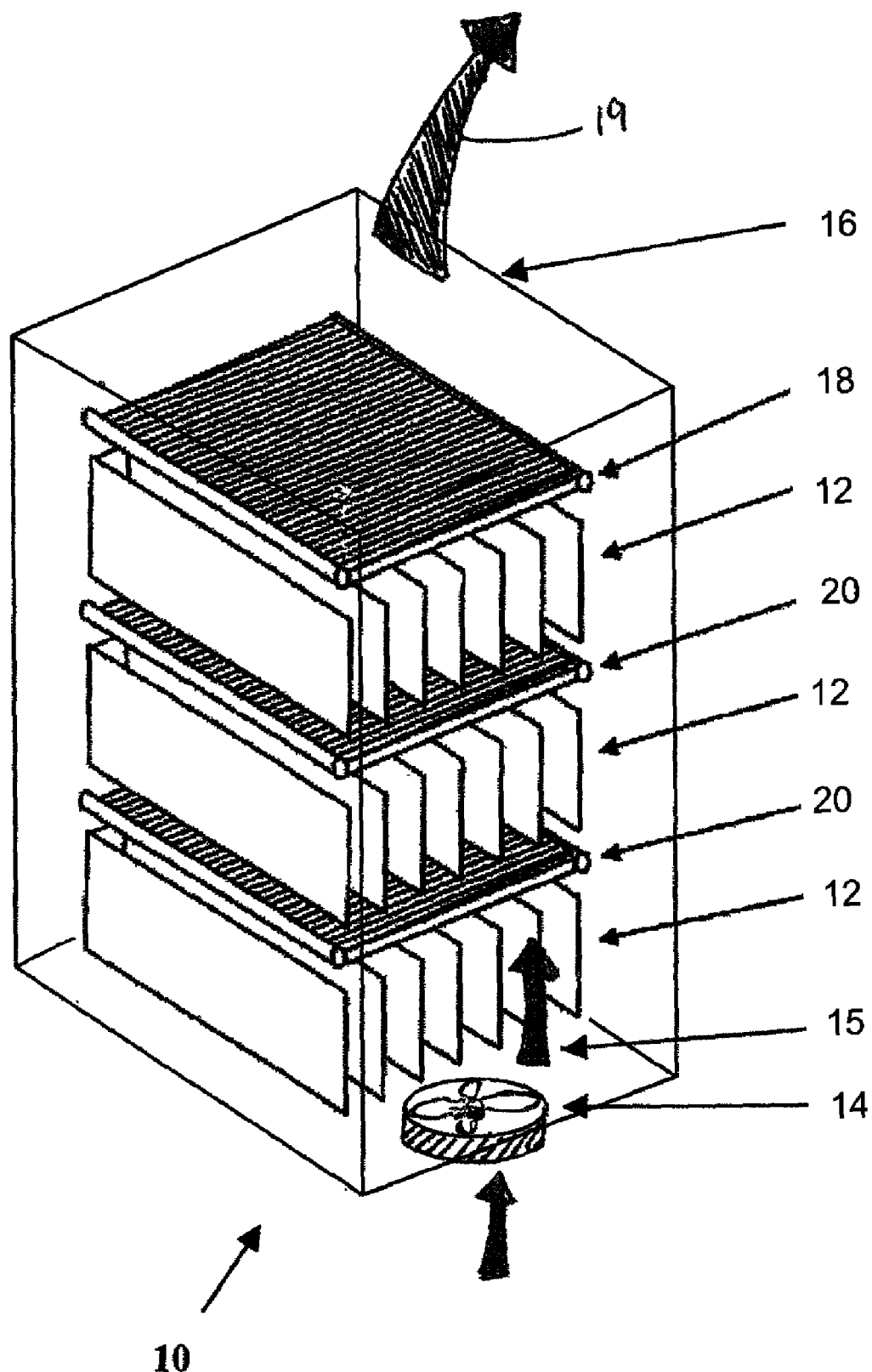
FIG. 1 is a perspective view schematically illustrating a system for cooling heat generating objects in a cabinet.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to FIG. 1, therein is illustrated an embodiment of a cooling system 10 for cooling heat generating objects 12 configured in banks within an enclosure such as a cabinet 16. Typically, the heat generating objects consist of electronic assemblies, such as circuit board assemblies, received in racks in the cabinet 16. The cooling system includes a fan 14, which induces airflow in the direction of arrow 15, into the cabinet 16 through an inlet, upwardly and through the cabinet 16, exiting the cabinet 16 through an outlet. It will be apparent to one skilled in the art that fan 14 can be located at any position that will induce airflow through cabinet 16, and that a plurality of fans can be used.

The airflow 15 cools the electronic equipment 12 as it passes through each bank of equipment. The cooling of the electronic equipment 12 causes an increase in the temperature of the flowing air stream, such that air stream 19 exiting the outlet at the top of cabinet 16 is warmer than that entering the air inlet of the cabinet 16. The air stream itself is cooled as it passes the heat exchangers 20 located between each bank of electronic equipment 12. The heat exchangers 20 are spaced apart from the equipment 12 such that an air space is defined between the equipment 12 and the heat exchangers 20. The air stream 19 is also cooled as it passes through the top heat exchanger 18 and exits outward, away from the components within cabinet 16, so that it does not add any unnecessary heat load to the room air conditioning.

Figure 2:
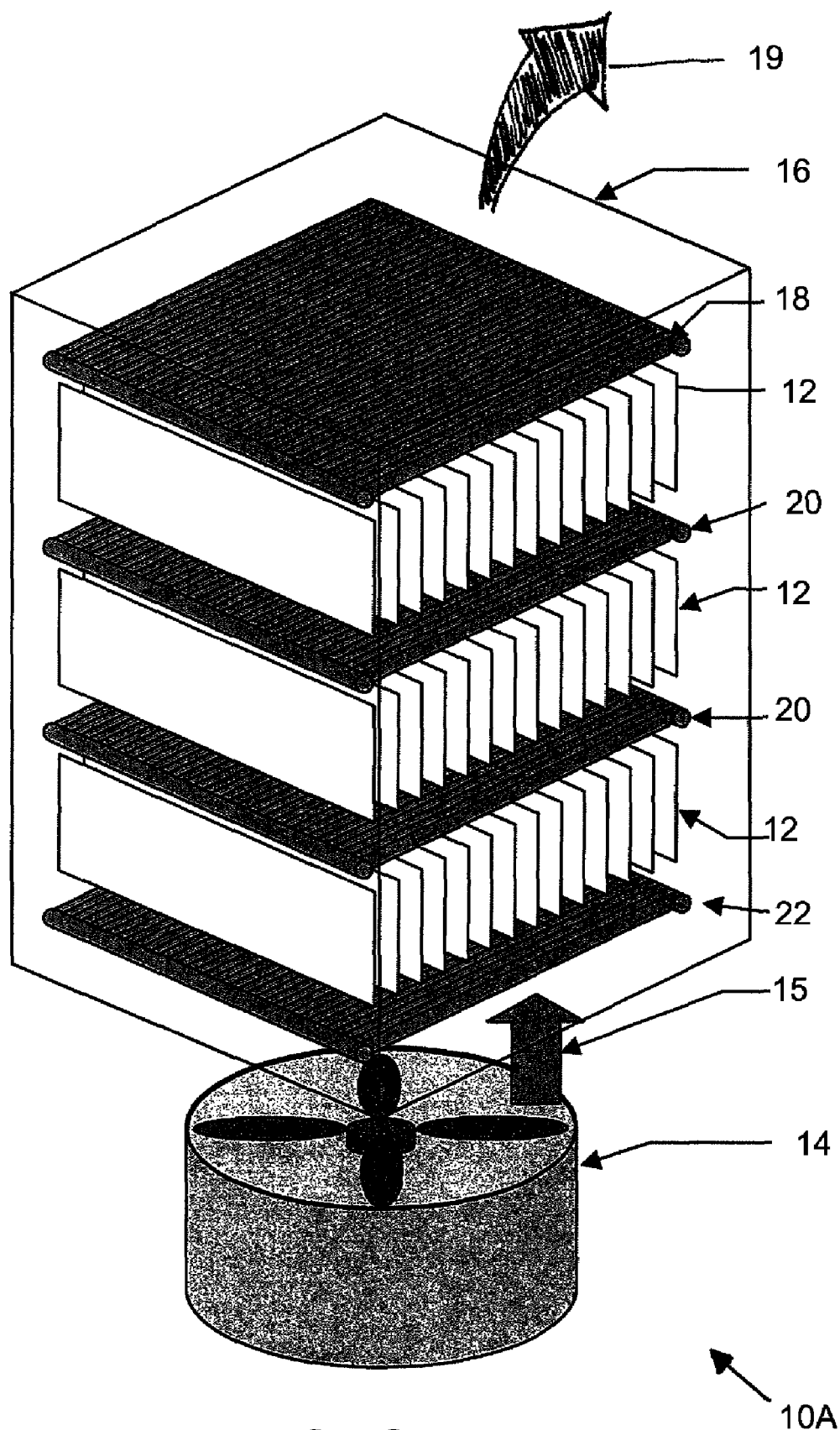
FIG. 2 is a perspective view schematically illustrating an alternative system for cooling heat generating objects in a cabinet.

Another system 10A is shown in FIG. 2, wherein a heat exchanger 22 is in front of, or alternately, before the first heat load or heat-generating device 12. As illustrated in FIG. 2, front heat exchanger 22 can be placed in-between fan 14 and the first heat-generating device 12. This allows for air to be "pre-cooled" prior to entering into or around the heat-generating devices. In a typical scenario, fan 14 induces airflow in the direction of arrow 15, upwardly and into cabinet 16 through an air inlet. The airflow first passes through front heat exchanger 22, where it is cooled prior to coming into contact with the heat generating devices 12. The now pre-cooled air then flows upwardly, through and/or around heat generating devices 12, and optionally through one or more additional, intermediate heat-exchangers 20, before passing through top heat exchanger 18 and exiting the cabinet 16 through an air outlet. As described previously, inclusion of a top heat exchanger 18 allows for the air steam 19 exiting the cabinet 16 to be cooled prior to exiting into the room, so as to minimize the effect on the heat load to the room air conditioning. As shown in FIG. 2, the heat generating devices 12 and the corresponding heat exchangers 18, 20, 22 are in a spaced-apart relationship, such that an air space is defined between the heat generating object 12 and the adjacent heat exchanger(s).

FIGS. 3 and 4 schematically illustrate front and side views of another exemplary cooling system 10B. As shown therein, cooling system 10B comprises a first fan 14 spaced in front of, or before front heat exchanger 22. The system 10B also comprises a plurality of heat-generating devices 12 arranged vertically (one device 12 positioned above another) within cabinet 16, with one or more heat exchangers 20 interspaced between them as necessary in order to obtain the most efficient cooling, as well as a top heat exchanger 18 spaced downstream of the heat-generating devices 12, but still within cabinet 16. An air space is defined between each device 12 and the adjacent heat exchanger 20. At the top end of system 10B near the cabinet's air outlet is a second fan, 24, which can be mounted externally to the cabinet 16, or can be optionally contained within cabinet 16. The use of a second fan 24 allows for the air that has been cooled by top heat exchanger 18 to be pulled upward and/or away from cabinet 16 and the components housed therein, so as to aid in minimizing addition of extra heat load to the room air conditioning system. In operation, the airflow stream is pulled into system 10B by first fan 14, and moves in the direction of arrow 15. Airflow is directed upward, through the cabinet, cooling the heat generating devices 12 as it passes through each bank. This airflow is itself further cooled as it passes front heat exchanger 20 and through or around the other heat exchangers 20 interspersed between devices 12. The airflow stream is then cooled a final time as it passes through or around top heat exchanger 18, and is drawn upward and out of cabinet 16 by second fan 24, pushing the air away from cabinet 16 and the components contained therein.

The second fan 24, as illustrated in FIGS. 3 and 4, can be attached directly to the top of cabinet 16. Alternatively, and equally acceptable, fan 24 can be contained at the upper portion of cabinet 16, such as intermediate between top heat exchanger 18 and the air outlet in the top panel of the cabinet. Equally acceptable, second fan 24 can be separated from the top of cabinet 16 by some distance, which can range from several millimeters to greater distances which will depend upon the strength of fan 24. For example, second fan 24 can be suspended from a roof structure, or be a part of or added into an existing cooling system.

FIGS. 1-4 show exemplary systems each having a plurality of heat generating objects and heat exchangers. Other embodiments include a single heat exchanger, such as front heat exchanger 22, downsteam of a heat-generating device such as a bank of computer boards. Such a cooling system could be particularly useful for aiding in the cooling of heat-generating equipment that does not need more than one heat exchanger in order to be effectively and efficiently cooled. A further advantage of the present invention is that it is scalable: that is, as many heat exchangers can be added incrementally as computer size and architecture dictate. As used herein, the term "downstream" refers to objects which follow another object, while the term "upstream" refers to objects which come before (although not necessarily immediately before) another object. In example, referring to FIG. 1, heat exchangers 20 are "downstream" of fan 14, and fan 14 is "upstream" of heat generating objects 12.

In certain exemplary embodiments, the heat exchangers are micro-channel refrigerant heat exchangers placed in the air stream after each vertically oriented bank of computer boards or other heat-generating device. With the use of micro-channel heat exchangers, the heat exchangers cool the hot air from each set of computer boards by transferring heat to a refrigerant (which is then pumped away) before that air contacts the next set of computer boards.

In some exemplary embodiments, the cooling refrigerant used is a non-conductive, two-phase refrigerant which acts as an alternative cooling medium instead of water so that a coolant leak does not pose a risk of an electrical short or similar hazard. This type of refrigerant allows for better heat transfer capacity in the same space because of the use of micro channel coils and because the refrigerant absorbs a significant amount of heat as it evaporates. The use of a two-phase refrigerant allows the heat exchangers to operate essentially isothermally, which provides a uniform air temperature to the computer boards. The use of such a system also allows for a smaller "footprint" than if water or other single-phase fluids are used.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An electronic component enclosure cooling system comprising:
    an enclosure located in a room of conditioned air, the enclosure comprising a cabinet and an access door thereto, the cabinet adapted to operatively house at least one substantially horizontal row of spaced apart, substantially vertically oriented electronic component boards;
    a plurality of electronic component boards disposed in the at least one row within the cabinet;
    an air mover system within the cabinet and adapted to draw the conditioned air into an opening in the enclosure, through the at least one row of boards, out an exit in the enclosure and back into the room;
    a first air-to-fluid heat exchanger located within the cabinet and between the opening and the first row of boards and adapted to remove a portion of the heat from the conditioned air before the air passes through the first row;
    a second air-to-fluid heat exchanger located within the cabinet between the exit and the at least one row of modules and adapted to remove a portion of the heat from the air before is returned to the room; and
    a pump system for pumping a two-phase refrigerant through the plurality of heat exchangers such that the air exiting the enclosure is substantially the same temperature as the conditioned air entering the enclosure.

2. The system of claim 1, wherein the air-to-fluid heat exchangers comprise micro-channel heat exchangers.

3. The system of claim 2, wherein the refrigerant is non-conductive.

4. The system of claim 2, wherein the air-to-fluid heat exchangers operate essentially isothermally.

5. The system of claim 4, wherein the air-to-fluid heat exchangers provide a uniform air temperature to the plurality of electronic modules in the enclosure.

6. The system of claim 1, wherein the air mover system is a fan located adjacent the air exit.

7. The system of claim 1, wherein the air mover system comprises a fan located adjacent the air opening.

8. A cooling system for an electronic component enclosure located in a room, the system comprising:
    an enclosure comprising a cabinet and at least one access door thereto, the cabinet adapted to house a plurality of substantially horizontal rows of spaced apart, vertically oriented electronic component modules;
    a plurality of electronic component modules disposed in a plurality of rows within the cabinet;
    an air mover system within the cabinet and adapted to draw room air into an opening in the enclosure, through the rows of modules and out an exit in the enclosure;
    a first air-to-fluid heat exchanger located within the cabinet between the opening and a first row of modules, such that the heat exchanger is upstream of the first row of modules to pre-cool the air that passes through the first row;
    a second air-to-fluid heat exchanger located within the cabinet downstream of the first row of modules and upstream of a second row of modules to pre-cool the air that passes through the second row of modules;
    a third air-to-fluid heat exchanger located within the cabinet between the exit and a third row of modules to cool the air that is returned to the room; and
    a pump system for pumping a two-phase refrigerant through the plurality of heat exchangers such that the air exiting the enclosure does not add to the heat load of the room.

9. The system of claim 8, wherein the air-to-fluid heat exchangers comprise micro-channel heat exchangers.

10. The system of claim 8, wherein the refrigerant is non-conductive.

11. The system of claim 9, wherein the air-to-fluid heat exchangers operate essentially isothermally.

12. The system of claim 11, wherein the air-to-fluid heat exchangers provide a uniform temperature to the plurality of electronic modules in the enclosure.

13. The system of claim 8, wherein the air mover system comprises a fan adjacent the air opening.

14. The system of claim 8, wherein the air mover system comprises a fan is located adjacent the air exit.

15. A method of cooling electronic components in an enclosure, comprising:
    locating an electronic components enclosure in a room of conditioned air, the enclosure comprising a cabinet with an access door thereto, the cabinet adapted to operatively house at least one substantially horizontal row of spaced apart, substantially vertically oriented electronic component boards;
    installing a plurality of electronic component boards in the at least one row within the cabinet;
    positioning a first air-to-fluid heat exchanger within the cabinet and between an enclosure air inlet and the first row of boards;
    positioning a second air-to-fluid heat exchanger within the cabinet between an enclosure air outlet and the at least one row of boards;
    providing an air mover system within the cabinet;
    drawing the conditioned air into the enclosure through the air inlet, through the first heat exchanger, the at least one row of boards, the second heat exchanger, out the air outlet in the enclosure and back into the room; and
    pumping a two-phase refrigerant through the plurality of heat exchangers such that the air exiting the enclosure is substantially the same temperature as the conditioned air entering the enclosure.

16. The method of claim 15, further comprising:
    removing a portion of the heat from the conditioned air before the air passes through the first row; and
    removing a portion of the heat from the air before is returned to the room.

17. The method of claim 16, wherein the air-to-fluid heat exchangers comprise micro-channel heat exchangers.

18. The method of claim 16, wherein the refrigerant is non-conductive.

19. The method of claim 17, further comprising operating the heat exchangers essentially isothermally.

* * * * *